US010050643B2

(12) United States Patent
Tai et al.

(10) Patent No.: US 10,050,643 B2
(45) Date of Patent: Aug. 14, 2018

(54) LOW-DENSITY PARITY-CHECK APPARATUS AND OPERATION METHOD THEREOF

(71) Applicant: VIA Technologies, Inc., New Taipei (TW)

(72) Inventors: Ying Yu Tai, Mountain View, CA (US); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/379,454

(22) Filed: Dec. 14, 2016

(65) Prior Publication Data

US 2018/0167087 A1 Jun. 14, 2018

(51) Int. Cl.
*H03M 13/00* (2006.01)
*H03M 13/25* (2006.01)
*H03M 13/37* (2006.01)
*G06F 11/10* (2006.01)

(52) U.S. Cl.
CPC ....... *H03M 13/255* (2013.01); *G06F 11/1004* (2013.01); *G06F 11/1096* (2013.01); *H03M 13/3746* (2013.01)

(58) Field of Classification Search
None
See application file for complete search history.

(56) References Cited

U.S. PATENT DOCUMENTS

| 7,398,453 | B2 * | 7/2008 | Yu ..................... | H03M 13/1111 714/778 |
|---|---|---|---|---|
| 2010/0042891 | A1 * | 2/2010 | Gunnam ............ | H03M 13/1111 714/752 |
| 2013/0139022 | A1 * | 5/2013 | Chen .................. | H03M 13/1117 714/752 |
| 2014/0089757 | A1 * | 3/2014 | Yang ................... | H03M 13/112 714/752 |

* cited by examiner

*Primary Examiner* — Daniel McMahon
(74) *Attorney, Agent, or Firm* — JCIPRNET

(57) ABSTRACT

The LDPC apparatus includes an LDPC iteration calculating circuit, a decision-bit storage circuit, and a convergence detection circuit. The LDPC iteration calculating circuit performs an LDPC iteration calculation to obtain a new decision bit value of a corresponding variable node. The decision-bit storage circuit uses the new decision bit value to update one corresponding old decision bit value among a plurality of old decision bit values. The convergence detection circuit stores check sums of a plurality of check nodes. The convergence detection circuit uses the new decision bit value and the corresponding old decision bit value to update one corresponding check sum among the check sums. The convergence detection circuit determines whether the LDPC iteration calculation is converged based on the check sums of the check nodes.

9 Claims, 4 Drawing Sheets

LOW-DENSITY PARITY-CHECK APPARATUS AND OPERATION METHOD THEREOF

BACKGROUND OF THE INVENTION

Field of the Invention

The invention relates to a parity check technique, and in particular, a low-density parity-check (LDPC) apparatus and an LDPC operation method.

Description of Related Art

Compared with conventional hard disk drives, a solid state drive (SSD) installed with a flash memory has characteristics such as fast read/write performance and low power consumption. The solid state drive is a commonly used data storage device. A system (firmware and hardware) of the solid state drive may perform a low-density parity-check (hereinafter referred to as LDPC) encoding on original data to obtain an original codeword and then write the codeword into the flash memory of the solid state drive. The system (firmware and hardware) of the solid state drive may also read the original codeword from the solid state drive and then perform an LDPC decoding on the original codeword to obtain a decoded codeword (original data).

A parity-check matrix H of LDPC defines the relationship between a plurality of variable nodes (VNs) and a plurality of check nodes (CNs). The parity-check matrix H may be determined according to the design needs. An iteration calculation of the LDPC decoding includes calculating V2C information transmitted from the variable nodes to the check nodes based on C2V information, and calculating the C2V information transmitted from the check nodes to the variable nodes based on the V2C information. Details of calculating the V2C information and calculating the C2V information are conventional art and are thus not repeatedly described here. "Calculating the V2C information of all of the variable nodes" once and "calculating the C2V information of all of the check nodes" once constitute one iteration. A conventional LDPC apparatus determines whether the LDPC iteration calculation is converged after completion of each iteration. When the LDPC iteration calculation is converged, it means that the LDPC decoding is successful, and the conventional LDPC apparatus may end/complete the LDPC iteration calculation.

Nonetheless, the conventional LDPC apparatus determines whether the LDPC iteration calculation is converged only after completion of each iteration.

SUMMARY OF THE INVENTION

The invention provides a low-density parity-check (hereinafter referred to as LDPC) apparatus and an LDPC operation method capable of determining whether an LDPC iteration calculation is converged in the process of one iteration without postponing the determination until completion of one iteration.

One embodiment of the invention provides an LDPC apparatus configured to decode an original codeword into a decoded codeword. The LDPC apparatus includes an LDPC iteration calculating circuit, a decision-bit storage circuit, and a convergence detection circuit. The LDPC iteration calculating circuit is configured to use the original codeword to perform an LDPC iteration calculation to obtain a new decision bit value of one corresponding variable node (VN) among a plurality of variable nodes. The decision-bit storage circuit is coupled to the LDPC iteration calculating circuit to receive the new decision bit value of the corresponding variable node. The decision-bit storage circuit is configured to use the new decision bit value to update one corresponding old decision bit value among a plurality of old decision bit values of the variable nodes stored in the decision-bit storage circuit. When the LDPC iteration calculation is converged, the old decision bit values of the variable nodes stored in the decision-bit storage circuit are used as the decoded codeword. The convergence detection circuit is coupled to the LDPC iteration calculating circuit to receive the new decision bit value. The convergence detection circuit is coupled to the decision-bit storage circuit to read the corresponding old decision bit value. The convergence detection circuit is configured to store a check sum of each of a plurality of check nodes (CNs). The convergence detection circuit uses the new decision bit value and the corresponding old decision bit value to update a corresponding check sum among the check sums. The convergence detection circuit determines whether the LDPC iteration calculation is converged based on the check sums of the check nodes.

One embodiment of the invention provides an LDPC operation method. The LDPC operation method includes: performing an LDPC iteration calculation by using an original codeword to obtain a new decision bit value of one corresponding variable node among a plurality of variable nodes; updating one corresponding old decision bit value among a plurality of old decision bit values of the variable nodes stored in a decision-bit storage circuit by using the new decision bit value, wherein the old decision bit values of the variable nodes stored in the decision-bit storage circuit are used as a decoded codeword when the LDPC iteration calculation is converged; storing a check sum of each of the plurality of check nodes; updating one corresponding check sum among the check sums by using the new decision bit value and the corresponding old decision bit value; and determining whether the LDPC iteration calculation is converged based on the check sums of the check nodes.

In light of the above, the LDPC apparatus and the LDPC operation method provided in the embodiments of the invention use the new decision bit value and the corresponding old decision bit value to update one corresponding check sum among the check sums in real time when any one of the plurality of variable nodes obtains the new decision bit value. Accordingly, the LDPC apparatus and the LDPC operation method provided in the embodiments of the invention may determine in real time whether the LDPC iteration calculation is converged based on the check sums of the check nodes and do not need to postpone the determination until all of the variable nodes obtain the new decision bit values when one iteration is completed.

To provide a further understanding of the aforementioned and other features and advantages of the invention, exemplary embodiments, together with the reference drawings, are described in detail below.

DESCRIPTION OF THE EMBODIMENTS

Throughout the text of the specification (including the claims), the term "couple (or connect)" refers to any direct or indirect connection means. For example, where a first device is described to be coupled (or connected) to a second device in the text, it should be interpreted that the first device may be directly connected to the second device, or that the first device may be indirectly connected to the second device through another device or some connection means. Moreover, wherever applicable, elements/components/steps referenced by the same numerals in the figures and embodiments refer to the same or similar parts. Elements/components/steps referenced by the same numerals or the same language in different embodiments may be mutually referred to for relevant descriptions.

Figure 1:
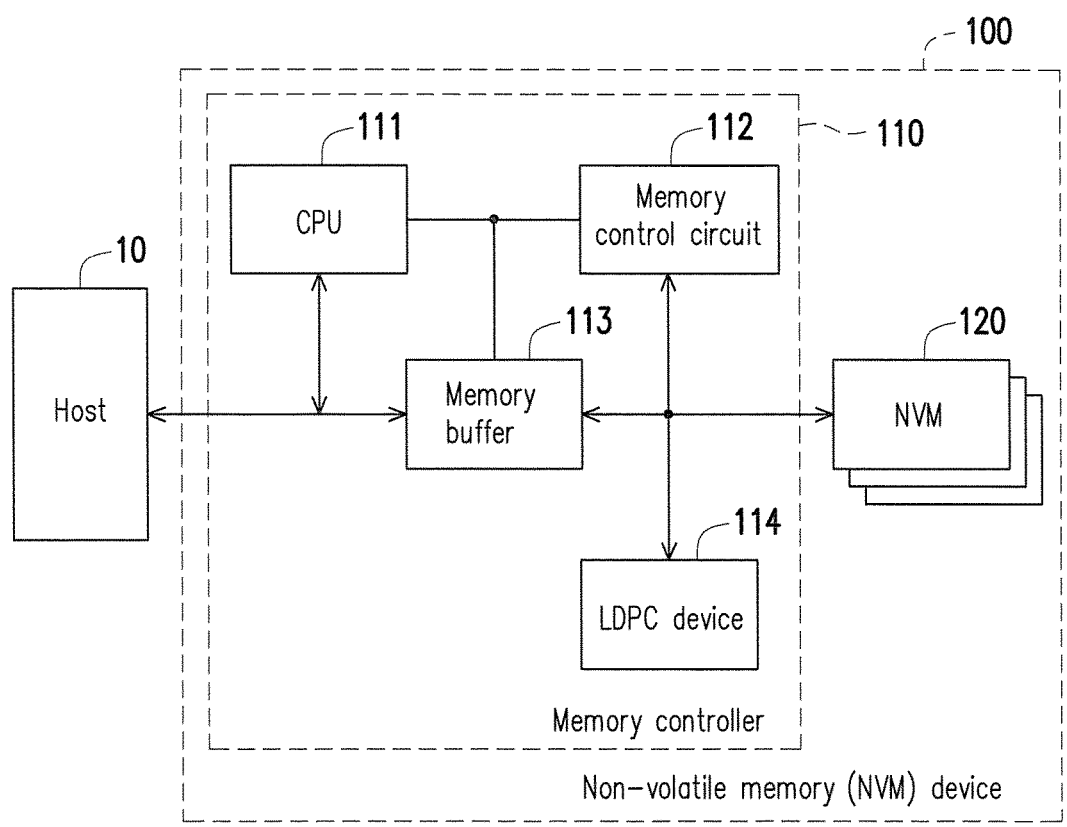
FIG. 1 is a circuit block schematic diagram illustrating a non-volatile memory apparatus according to one embodiment of the invention.

FIG. 1 is a circuit block schematic diagram illustrating a non-volatile memory (NVM) apparatus 100 according to one embodiment of the invention. According to the design needs, the NVM apparatus 100 may be a flash drive, a solid state disc (SSD), or another storage apparatus. The NVM apparatus 100 may be coupled to a host 10. The host 10 may be a computer, a handheld phone, a multimedia player, a camera, or another electronic device. The NVM apparatus 100 includes a controller (a controller circuit) 110 and a NVM 120. According to the design needs, the NVM 120 may be a NAND flash memory or another non-volatile storage circuit/device.

The controller 110 is coupled (or connected) to the NVM 120. The controller 110 may access the NVM 120 according to a logical address of a write command of the host 10. In some embodiments, the logical address information may be a logical block address (LBA) or another logical address. In the embodiment illustrated in FIG. 1, the controller 110 includes a central processing unit (CPU) 111, a memory control circuit 112, a memory buffer 113, and a low-density parity-check (hereinafter referred to as LDPC) apparatus 114. The CPU 111 is coupled to the host 10 through a communication interface. According to the design needs, the communication interface includes a small computer system interface (SCSI), a serial attached SCSI (SAS), an enhanced small disk interface (ESDI), a serial advanced technology attachment (SATA), a peripheral component interconnect express (PCI-express), an integrated drive electronics (IDE) interface, a universal serial bus (USB), a thunderbolt interface, or another interface. The present embodiment does not limit the interface structure between the host 10 and the NVM apparatus 100.

When the host 10 sends the write command, data to be written may be temporarily stored in the memory buffer 113, and the CPU 111 converts/decodes the write command (including the logical address) of the host 10 into a corresponding internal control signal (including a physical address of the NVM 120) and provides the internal control signal to the memory control circuit 112 and/or the memory buffer 113. The memory buffer 113 is, for example, a dynamic random access memory (DRAM), a static random access memory (SRAM), or another volatile memory. The LDPC apparatus 114 may execute an LDPC algorithm to encode the data temporarily stored in the memory buffer 113 into a codeword. According to the internal control signal, the memory control circuit 112 may address/control the NVM 120 to write the codeword into the NVM 120.

When the host 10 sends a read command, the CPU 111 converts/decodes the read command (including a logical address) of the host 10 into a corresponding internal control signal (including the physical address of the NVM 120). According to the internal control signal, the memory control circuit 112 may address/control the NVM 120 to read the original codeword from the NVM 120. The LDPC apparatus 114 may execute the LDPC algorithm to decode the original codeword into data and temporarily store the decoded codeword in the memory buffer 113. Then, the CPU 111 may transmit the decoded codeword temporarily stored in the memory buffer 113 back to the host 10.

A parity-check matrix H of LDPC defines the relationship between a plurality of variable nodes (VNs) and a plurality of check nodes (CNs). A number of rows of the parity-check matrix H represents a number of the check nodes, and a number of columns of the parity-check matrix H represents a number of the variable nodes. In an LDPC calculation process, information is transmitted between the variable nodes and the check nodes. After a plurality of iteration calculations in the LDPC calculation process, information of the variable nodes is converged and an LDPC decoding calculation is completed. When the LDPC iteration calculation is converged, a decision bit value of the information of the variable nodes is used as the decoded codeword. The decision bit is also referred to as a sign bit.

Figure 2:
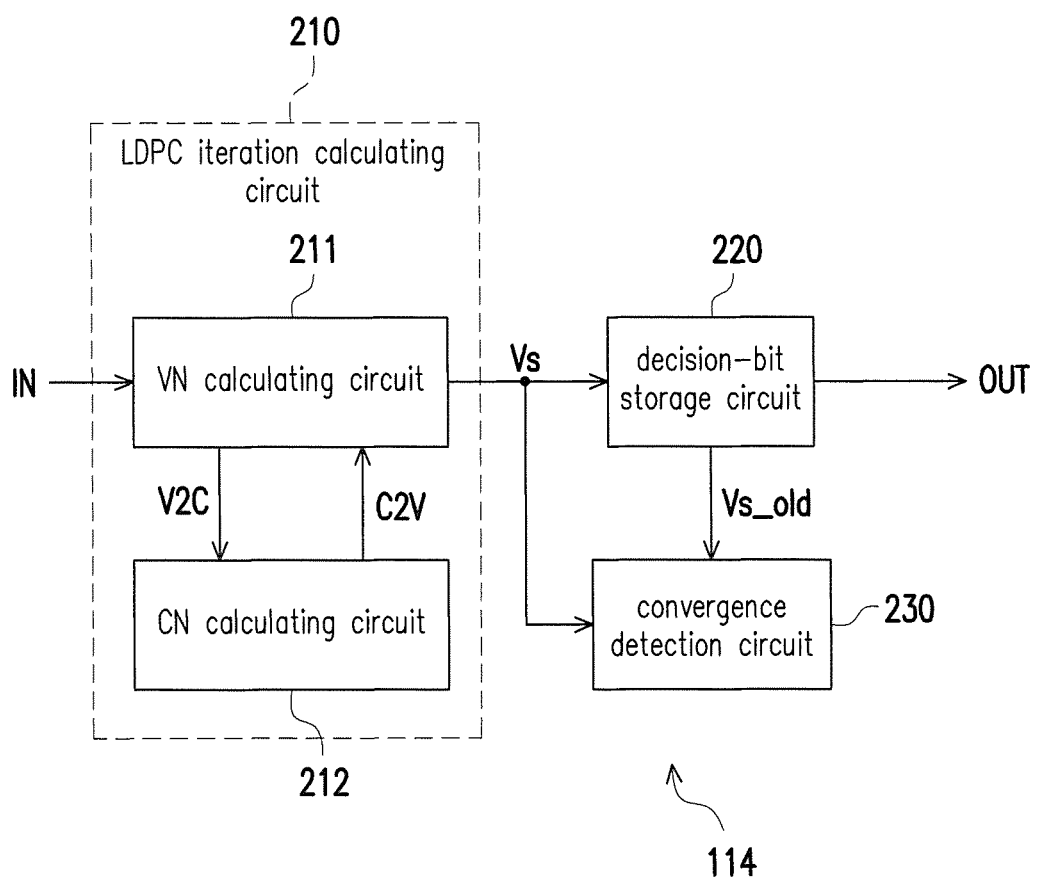
FIG. 2 is a circuit block schematic diagram illustrating the LDPC apparatus shown in FIG. 1 according to one embodiment of the invention.

FIG. 2 is a circuit block schematic diagram illustrating the LDPC apparatus 114 shown in FIG. 1 according to one embodiment of the invention. The LDPC apparatus 114 performs an LDPC iteration calculation to decode an original codeword IN to obtain a decoded codeword OUT. In the embodiment illustrated in FIG. 2, the LDPC apparatus 114 includes an LDPC iteration calculating circuit 210, a decision-bit storage circuit 220, and a convergence detection circuit 230. The LDPC iteration calculating circuit 210 uses the original codeword IN to perform the LDPC iteration calculation to obtain decision bit values Vs of a plurality of variable nodes. The LDPC apparatus 114 may divide a parity-check matrix H of LDPC into a plurality of submatrices. Each submatrix is referred to as a circulant. The LDPC iteration calculating circuit 210 may use each of the circulants to calculate a new decision bit value Vs of at least one corresponding variable node.

In the embodiment illustrated in FIG. 2, the LDPC iteration calculating circuit 210 includes a variable node (VN) calculating circuit 211 and a check node (CN) calculating circuit 212. According to the design needs, in some embodiments, the LDPC apparatus 114 further includes a log likelihood ratio (hereinafter referred to as LLR) converting circuit (not illustrated). The LLR converting circuit (not illustrated) may convert the original codeword IN into an LLR vector according to a mapping relationship and sends it to the VN calculating circuit 211. Alternatively, in other embodiments (in the embodiment illustrated in FIG. 2, for example), the LLR converting circuit may be embedded in the VN calculating circuit 211 according to the design needs. Accordingly, the VN calculating circuit 211 may convert the original codeword IN into an LLR vector according to a mapping relationship. In some embodiments, the LLR converting circuit may be a front-end circuit independently provided outside the LDPC apparatus 114. Any one LLR value in the LLR vector represents a likelihood of "a specific bit of the original codeword IN being a specific value". A range of an LLR may be from −x to x. In some embodiments, −x represents that a specific bit of the original codeword IN is verified to be logic "1", and x represents that a specific bit of the original codeword IN is verified to be logic "0". In other embodiments, −x represents that a specific bit of the original codeword IN is verified to be logic "0", and x represents that a specific bit of the original codeword IN is verified to be logic "1".

The VN calculating circuit 211 uses the LLR vector and at least C2V information (i.e., "C2V" illustrated in FIG. 2, provided by the CN calculating circuit 212) to calculate V2C information from the variable nodes to the check nodes. The calculation performed by the VN calculating circuit 211 is equivalent to a column processing of the parity-check matrix H. Details of calculating the V2C information performed by the VN calculating circuit 211 may be a conventional algorithm or another algorithm and thus are not repeatedly described here. The VN calculating circuit 211 outputs a decision bit value Vs of new information of the variable nodes to the decision-bit storage circuit 220. The CN calculating circuit 212 is coupled to the VN calculating circuit 211 to receive the V2C information (i.e., "V2C" illustrated in FIG. 2). The CN calculating circuit 212 uses the V2C information to calculate the C2V information from the check nodes to the variable nodes and provides the C2V information (i.e., "C2V" illustrated in FIG. 2) to the VN calculating circuit 211. The calculation performed by the CN calculating circuit 212 is equivalent to a row processing of the parity-check matrix H. Details of calculating the C2V information performed by the CN calculating circuit 212 may be a conventional algorithm or another algorithm and thus are not repeatedly described here. At this time, the VN calculating circuit 211 and the CN calculating circuit 212 have completed one iteration.

Figure 3:
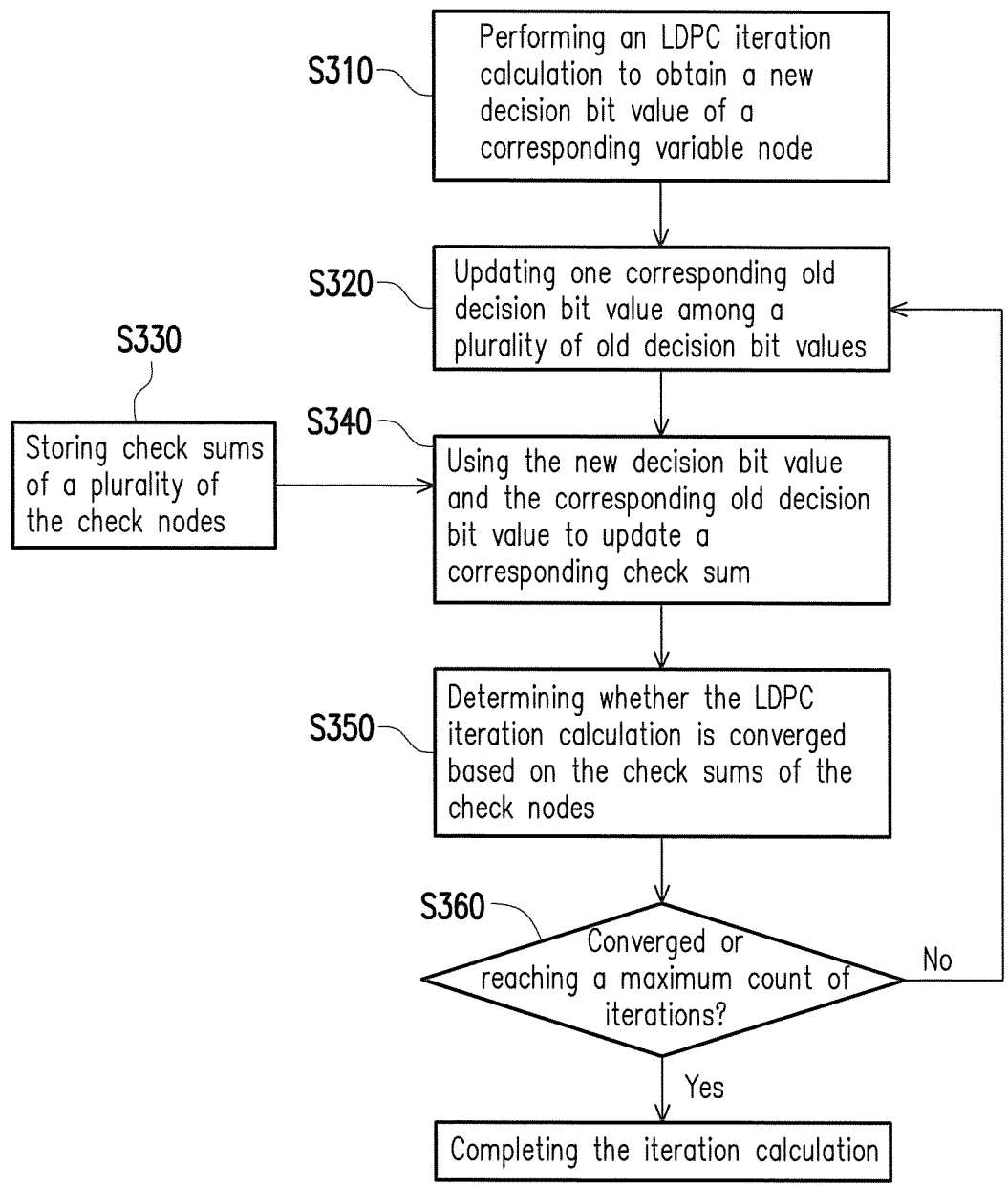
FIG. 3 is a flowchart illustrating an LDPC operation method according to one embodiment of the invention.

FIG. 3 is a flowchart illustrating an LDPC operation method according to one embodiment of the invention. Referring to FIG. 2 and FIG. 3, in step S310, the LDPC iteration calculating circuit 210 uses an original codeword IN to perform an LDPC iteration calculation to obtain a new decision bit value Vs of a corresponding variable node. The decision-bit storage circuit 220 is coupled to the LDPC iteration calculating circuit 210 to receive the new decision bit value Vs of the corresponding variable node. In step S320, the decision-bit storage circuit 220 uses the new decision bit value Vs to update one corresponding old decision bit value Vs_old among a plurality of old decision bit values of the variable nodes stored in the decision-bit storage circuit 220. When the LDPC iteration calculation is converged, the old decision bit values of the variable nodes stored in the decision-bit storage circuit 220 can be used as a decoded codeword OUT.

The convergence detection circuit 230 is coupled to the LDPC iteration calculating circuit 210 to receive the new decision bit value Vs. The convergence detection circuit 230 uses a parity-check matrix H to calculate check sums of each of the plurality of check nodes. The convergence detection circuit 230 stores the check sums of each of the check nodes (step S330).

The convergence detection circuit 230 is further coupled to the decision-bit storage circuit 220. Before the corresponding old decision bit value Vs_old stored in the decision-bit storage circuit 220 is updated, the convergence detection circuit 230 reads the corresponding old decision bit value Vs_old from the decision-bit storage circuit 220. In step S340, the convergence detection circuit 230 uses the new decision bit value Vs (provided by the LDPC iteration calculating circuit 210) and the corresponding old decision bit value Vs_old (provided by the decision-bit storage circuit 220) to update one corresponding check sum among the check sums. Accordingly, when any one of the plurality of variable nodes obtains a new decision bit value Vs, the convergence detection circuit 230 may update one corresponding check sum among the check sums in real time.

For example, in step S340, the convergence detection circuit 230 uses the corresponding old decision bit value Vs_old provided by the decision-bit storage circuit 220 to remove an element corresponding to the corresponding old decision bit value Vs_old in the corresponding check sum and then add an element corresponding to the new decision bit value Vs provided by the LDPC iteration calculating circuit 210 into the corresponding check sum. According to the design needs, in some embodiments, an equation Check_Sum_New=Check_Sum_Old XOR D_Old XOR D_New is calculated in step S340 to update the corresponding check sum. Specifically, Check_Sum_New is the corresponding check sum after being updated, Check_Sum_Old is the corresponding check sum before being updated, D_Old is an old decision bit value (the corresponding old decision bit value Vs_old) of an $i^{th}$ variable node among the plurality of variable nodes, D_New is a new decision bit value (the new decision bit value Vs) of the $i^{th}$ variable node, and XOR is an exclusive-OR operation. Supposing that the $i^{th}$ variable node is connected to a $j^{th}$ check node, in step S340, the convergence detection circuit 230 uses the foregoing equation to calculate the corresponding check sum Check_Sum_New of the $j^{th}$ check node.

In step S350, based on the check sums of the check nodes, the convergence detection circuit 230 determines whether the LDPC iteration calculation is converged. For example (but not limited hereto), the convergence detection circuit 230 checks whether the check sums of the check nodes are all 0. When the check sums are all 0, the convergence detection circuit 230 determines that the LDPC iteration calculation is converged. If it is determined in step S360 that the LDPC iteration calculation is not converged yet, it means that the LDPC decoding is not successful yet, and steps S310, S320, S330, S340, S350, and S360 will be executed again.

The LDPC apparatus 114 provided in the present embodiment uses the new decision bit value Vs and the corresponding old decision bit value Vs_old to update one corresponding check sum among the check sums in real time when any one of the plurality of variable nodes obtains the new decision bit value Vs. Accordingly, the LDPC apparatus 114 and the LDPC operation method provided in the present embodiment can determine in real time whether the LDPC iteration calculation is converged based on the check sums of the check nodes and do not need to postpone the determination until completion of one complete iteration. For a layered LDPC decoding algorithm (i.e., performing an LDPC decoding layer by layer in a parity-check matrix H), a decoding operation of each layer is referred to as a sub-iteration. The LDPC apparatus 114 and the LDPC operation method provided in the present embodiment can update the corresponding check sum in real time to determine whether the LDPC iteration calculation is converged and do not need to postpone the determination until completion of one complete sub-iteration.

When it is determined in step S360 that the LDPC iteration calculation is converged, it means that the LDPC decoding is successful and the LDPC iteration calculation can thus be ended. In some cases, a count of iterations of the LDPC iteration calculation has reached a maximum count of iterations, but the LDPC iteration calculation is not converged yet. At this time, decoding of the LDPC iteration calculation may be determined to fail and the iteration calculation is ended.

Figure 4:
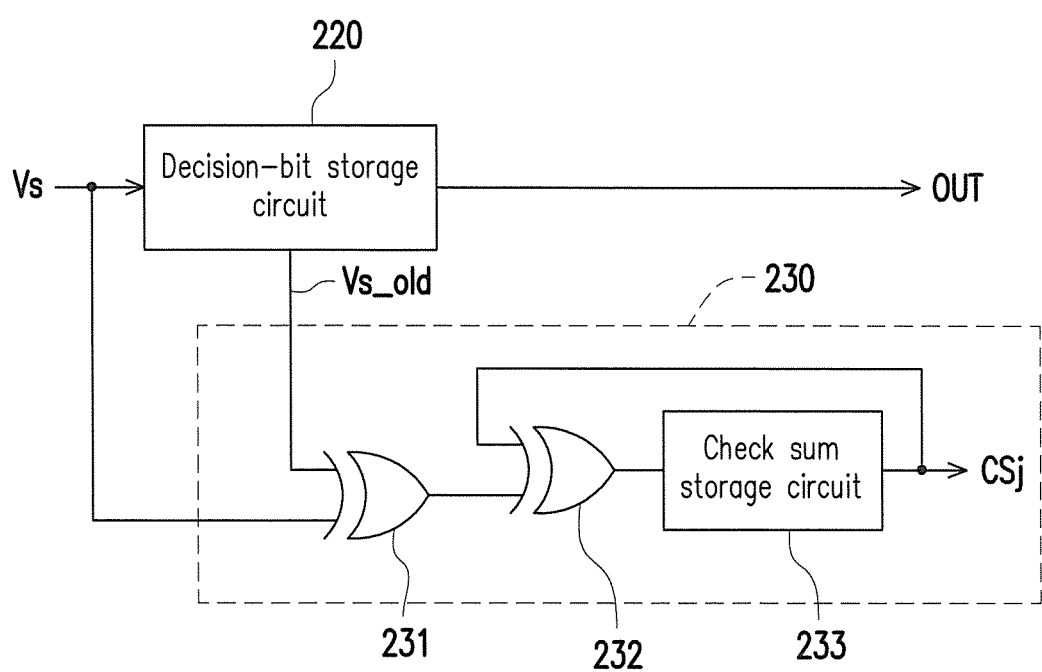
FIG. 4 is a circuit block schematic diagram illustrating a convergence detection circuit shown in FIG. 2 according to one embodiment of the invention.

FIG. 4 is a circuit block schematic diagram illustrating the convergence detection circuit 230 shown in FIG. 2 according to one embodiment of the invention. In the embodiment illustrated in FIG. 4, the convergence detection circuit 230 includes a first XOR gate 231, a second XOR gate 232, and a check sum storage circuit 233. A first input terminal of the first XOR gate 231 is coupled to the LDPC iteration calculating circuit 210 to receive a new decision bit value Vs. A second input terminal of the first XOR gate 231 is coupled to the decision-bit storage circuit 220 to read a corresponding old decision bit value Vs_old. A first input terminal of the second XOR gate 232 is coupled to an output terminal of the first XOR gate 231. An output terminal of the check sum storage circuit 233 is coupled to a second input terminal of the second XOR gate 232 to provide the corresponding check sum CSj (an old check sum). An output terminal of the second XOR gate 232 is coupled to an input terminal of the check sum storage circuit 233 to update the corresponding check sum CSj in real time.

It shall be noted that, in different applied situations, the relevant functions of the above-described controller 110, CPU 111, memory control circuit 112, memory buffer 113, LDPC apparatus 114, LDPC iteration calculating circuit 210, decision-bit storage circuit 220, and/or convergence detection circuit 230 may be implemented as software, firmware, or hardware by utilizing common programming languages (e.g., C or C++), hardware description languages (e.g., Verilog HDL or VHDL), or other adequate programming languages. The software (or the firmware) capable of executing the relevant functions can be arranged into any known computer-accessible media such as magnetic tapes, semiconductor memories, magnetic disks, or compact disks (e.g., CD-ROM or DVD-ROM); or the software (or the firmware) may be transmitted via the Internet, a wired communication, a wireless communication, or other communication media. The software (or the firmware) may be stored in the computer-accessible media, so that a computer processor can access/execute programming codes of the software (or the firmware). In addition, the apparatus and the method of the invention can also be implemented by a combination of hardware and software.

In summary of the above, the LDPC apparatus 114 and the LDPC operation method provided in the embodiments of the invention use the new decision bit value Vs and the corresponding old decision bit value Vs_old to update one corresponding check sum among the check sums in real time when any one of the plurality of variable nodes obtains the new decision bit value Vs. Accordingly, the LDPC apparatus 114 and the LDPC operation method provided in the embodiments of the invention can determine in real time whether the LDPC iteration calculation is converged based on the check sums of the check nodes and do not need to postpone the determination until all of the variable nodes obtain the new decision bit values when one complete iteration (or one complete sub-iteration) is completed.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A low-density parity-check (hereinafter referred to as LDPC) apparatus configured to decode an original codeword into a decoded codeword, the LDPC apparatus comprising:
   an LDPC iteration calculating circuit configured to perform an LDPC iteration calculation by using the original codeword to obtain a new decision bit value of a corresponding variable node among a plurality of variable nodes;
   a decision-bit storage circuit, coupled to the LDPC iteration calculating circuit to receive the new decision bit value of the corresponding variable node, configured to use the new decision bit value to update one corresponding old decision bit value among a plurality of old decision bit values of the variable nodes stored in the decision-bit storage circuit, wherein the old decision bit values of the variable nodes stored in the decision-bit storage circuit are used as the decoded codeword when the LDPC iteration calculation is converged; and
   a convergence detection circuit coupled to the LDPC iteration calculating circuit to receive the new decision bit value and coupled to the decision-bit storage circuit to read the corresponding old decision bit value, wherein the convergence detection circuit is configured to store multiple check sums, and each of the check sums corresponds to each of a plurality of check nodes, and the convergence detection circuit is configured to use the new decision bit value and the corresponding old decision bit value to update a corresponding check sum among the check sums, and determine whether the LDPC iteration calculation is converged when one of the check sums is updated.

2. The LDPC apparatus according to claim 1, wherein the convergence detection circuit is configured to calculate the check sums by using a parity-check matrix.

3. The LDPC apparatus according to claim 1, wherein the convergence detection circuit is configured to use the corresponding old decision bit value provided by the decision-bit storage circuit to remove an element corresponding to the corresponding old decision bit value in the corresponding check sum, and then add an element corresponding to the new decision bit value provided by the LDPC iteration calculating circuit into the corresponding check sum.

4. The LDPC apparatus according to claim 1, wherein the convergence detection circuit is configured to calculate Check_Sum_New=Check_Sum_Old XOR D_Old XOR D_New, wherein Check_Sum_New is the corresponding check sum after being updated, Check_Sum_Old is the corresponding check sum before being updated, D_Old is the corresponding old decision bit value, D_New is the new decision bit value, and XOR is an exclusive-OR operation.

5. The LDPC apparatus according to claim 1, wherein the convergence detection circuit comprises:
   a first XOR gate, a first input terminal of the first XOR gate being coupled to the LDPC iteration calculating circuit to receive the new decision bit value, and a second input terminal of the first XOR gate being coupled to the decision-bit storage circuit to read the corresponding old decision bit value;
   a second XOR gate, a first input terminal of the second XOR gate being coupled to an output terminal of the first XOR gate; and
   a check sum storage circuit, an input terminal of the check sum storage circuit being coupled to an output terminal of the second XOR gate, and an output terminal of the check sum storage circuit being coupled to a second input terminal of the second XOR gate to provide the corresponding check sum.

6. A low-density parity-check (hereinafter referred to as LDPC) operation method executed by a processor comprising:
performing an LDPC iteration calculation by using an original codeword to obtain a new decision bit value of a corresponding variable node among a plurality of variable nodes;
updating one corresponding old decision bit value among a plurality of old decision bit values of the variable nodes stored in a decision-bit storage circuit by using the new decision bit value, wherein the old decision bit values of the variable nodes stored in the decision-bit storage circuit are used as a decoded codeword when the LDPC iteration calculation is converged;
storing multiple check sums, and each of the check sums corresponds to each of a plurality of check nodes;
updating a corresponding check sum among the check sums by using the new decision bit value and the corresponding old decision bit value; and
determining whether the LDPC iteration calculation is converged when one of the check sums is updated.

7. The LDPC operation method according to claim 6, further comprising:
calculating the check sums by using a parity-check matrix.

8. The LDPC operation method according to claim 6, wherein the step of updating the corresponding check sum among the check sums comprises:
removing an element corresponding to the corresponding old decision bit value in the corresponding check sum by using the corresponding old decision bit value; and
adding an element corresponding to the new decision bit value into the corresponding check sum.

9. The LDPC operation method according to claim 6, wherein the step of updating the corresponding check sum among the check sums comprises:
calculating Check_Sum_New=Check_Sum_Old XOR D_Old XOR D_New, wherein Check_Sum_New is the corresponding check sum after being updated, Check_Sum_Old is the corresponding check sum before being updated, D_Old is the corresponding old decision bit value, D_New is the new decision bit value, and XOR is an exclusive-OR operation.

* * * * *